(12) United States Patent
Cohen et al.

(10) Patent No.: US 9,876,007 B1
(45) Date of Patent: Jan. 23, 2018

(54) MIMCAP CREATION AND UTILIZATION METHODOLOGY

(71) Applicant: APPLIED MICRO CIRCUITS CORPORATION, Santa Clara, CA (US)

(72) Inventors: Ronen Cohen, Sunnyvale, CA (US); Alfred Yeung, Fremont, CA (US); Ojas Dharia, Santa Clara, CA (US)

(73) Assignee: MACOM CONNICTIVITY SOLUTIONS, LLC, Lowell, MA (US)

( * ) Notice: Subject to any disclaimer, the term of this patent is extended or adjusted under 35 U.S.C. 154(b) by 0 days.

(21) Appl. No.: 15/149,244

(22) Filed: May 9, 2016

(51) Int. Cl.
| | | |
|---|---|---|
| H01L 21/8242 | (2006.01) | |
| H01L 27/02 | (2006.01) | |
| H01L 49/02 | (2006.01) | |
| H01L 23/522 | (2006.01) | |
| H01L 23/535 | (2006.01) | |
| G06F 17/50 | (2006.01) | |

(52) U.S. Cl.
CPC ...... *H01L 27/0288* (2013.01); *G06F 17/5072* (2013.01); *G06F 17/5077* (2013.01); *G06F 17/5081* (2013.01); *H01L 23/5223* (2013.01); *H01L 23/535* (2013.01); *H01L 27/0207* (2013.01); *H01L 28/60* (2013.01)

(58) Field of Classification Search
CPC .................................................. H01L 21/8242
See application file for complete search history.

(56) References Cited

U.S. PATENT DOCUMENTS

| | | |
|---|---|---|
| 6,704,179 B2 | 3/2004 | Voldman |
| 7,564,709 B2 | 7/2009 | Chen et al. |
| 8,030,962 B2 | 10/2011 | Rahim et al. |
| 9,153,504 B2 | 10/2015 | Lai et al. |
| 9,257,409 B2 | 2/2016 | Tzeng et al. |
| 9,281,802 B2 | 3/2016 | Bakalski |
| 9,299,765 B2 | 3/2016 | Edelstein et al. |
| 9,324,780 B2 | 4/2016 | Jen et al. |

*Primary Examiner* — Marvin Payen
(74) *Attorney, Agent, or Firm* — Amin, Turocy & Watson LLP

(57) ABSTRACT

A metal-insulator-metal (MIM) capacitor design methodology and system substantially maximizes the benefits of including MIM capacitors in an integrated circuit design while substantially minimizing the negative impacts resulting from increased capacitance. A process analysis is performed on an integrated circuit design to determine a metal layer that is likely to be most adversely affected by the presence of MIM capacitor cells. The MIM capacitor cells are then designed to have specific sizes and orientations based on results of the process analysis, taking the most affected metal layer into consideration. Finally, the MIM capacitor cells are placed at selected locations on the die in an algorithmic fashion in order to satisfy a design target of maximizing coverage area while avoiding interference with signal paths and critical or sensitive components.

10 Claims, 8 Drawing Sheets

MIMCAP CREATION AND UTILIZATION METHODOLOGY

TECHNICAL FIELD

The subject disclosure relates generally to semiconductor design, and, for example, to a MIM capacitor design methodology and system that achieves a high MIM capacitor density while minimizing adverse impacts on circuit operation.

BACKGROUND

Metal-insulator-metal (MIM) capacitors are often used in very-large-scale integration (VLSI) designs implemented on semiconductor chips, either as part of the primary circuit design or to provide decoupling capacitance for supply noise suppression. MIM capacitors are intended to improve capacitance density of the VLSI design while minimizing area overhead. FIG. 1 is a cross-section of an example semiconductor chip 100 that includes a MIM capacitor. The MIM capacitor comprises a capacitor top metal (CTM) node 104 and a capacitor bottom metal (CBM) node 106 formed on the top and bottom side, respectively, of a dielectric layer 108. The MIM capacitor layers reside between two metal layers MX and MX+1, on which die interconnection paths 110 are patterned. The MIM capacitor is insulated by an insulating layer 102. Conductive vias 112 are formed in the die to electrically connect circuit paths in the metal layers to the CTM node 104 or the CBM node 106 as needed.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a semiconductor chip is provided, comprising a first metal layer; a second metal layer; and metal-insulator-metal (MIM) capacitor cells between the first metal layer and the second metal layer, wherein the MIM capacitor cells have substantially equal widths, the MIM capacitor cells have varying lengths, and the MIM capacitor cells are oriented to cause a lengthwise direction of the MIM capacitor cells to match a routing orientation of a metal layer, of the first metal layer or the second metal layer, that is more impacted by a capacitance increase caused by inclusion of the MIM capacitor cells.

Also, a method for placement of metal-insulator-metal (MIM) capacitors on a semiconductor chip is provided, comprising analyzing, by a system comprising a processor, design information relating to an integrated circuit design; identifying, by the system based on a result of the analyzing, which metal layer, of the first metal layer or the second metal layer, has a likelihood of being more affected by presence of the MIM capacitor cells; and setting, by the system, a lengthwise orientation of the MIM capacitor cells on the semiconductor chip that matches a routing orientation of the metal layer that has the likelihood of being more affected by the presence of the MIM capacitor cells.

In addition, an integrated circuit is provided, comprising a metal-insulator-metal (MIM) capacitor layer in which MIM capacitor cells are formed; a first metal layer that neighbors a top side of the MIM capacitor layer; and a second metal layer that neighbors a bottom side of the MIM capacitor layer, wherein the MIM capacitor cells are oriented lengthwise in a same direction as a routing orientation of a metal layer, of the first metal layer or the second metal layer, that is more affected by a capacitance increase caused by the MIM capacitor cells, the MIM capacitor cells have equal widths that are substantially equal to a width of a power grid of the metal layer, the MIM capacitor cells have varying lengths corresponding to a set of defined lengths; and the MIM capacitor cells are placed on the integrated circuit at areas of the MIM capacitor layer that avoid overlap between the MIM capacitor cells and signal paths located on the first metal layer and the second metal layer.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
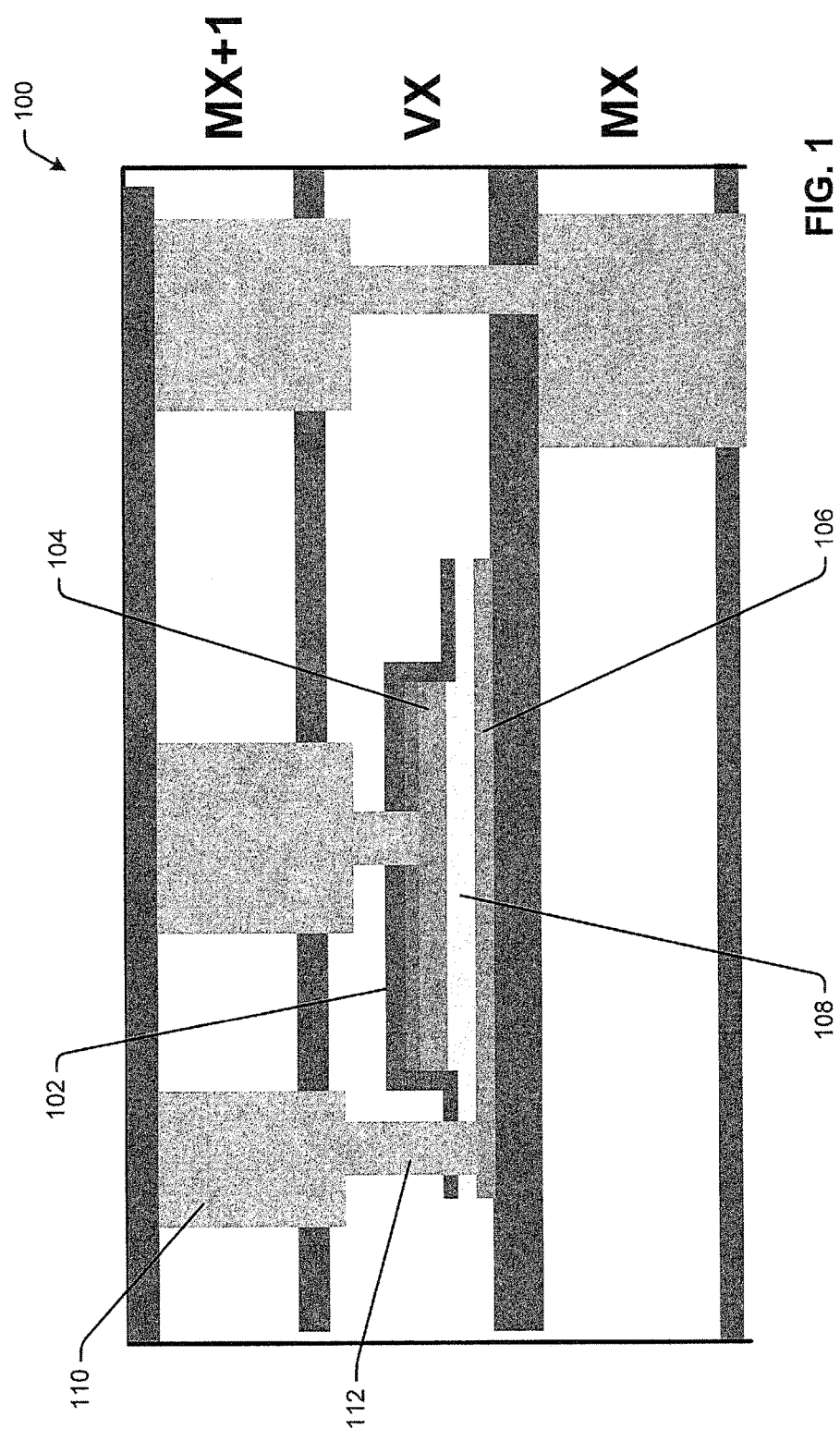
FIG. 1 is a cross-section of an example semiconductor chip that includes a MIM capacitor.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Figure 2:
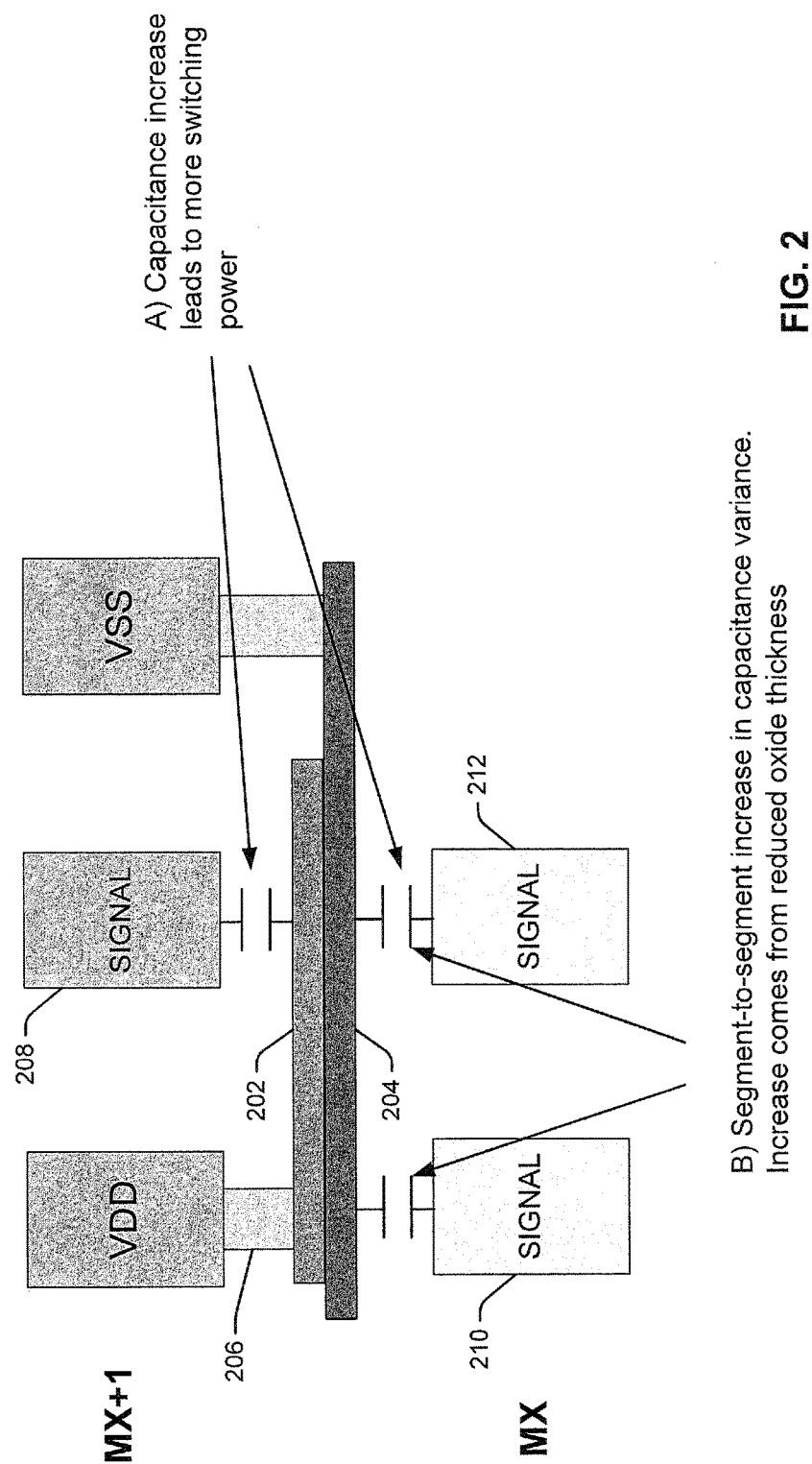
FIG. 2 is a cross-section of an example semiconductor chip illustrating unintended capacitance impact on a VLSI design resulting from inclusion of a MIM capacitor.

MIM capacitors are an advancement in the process of semiconductor manufacturing, providing high decoupling capacitance density while maintaining a relatively low area overhead. However, the addition of MIM capacitors into a VLSI design can physically change the design in a manner that impacts capacitance to signals in neighboring layers. FIG. 2 is a cross-section of an example semiconductor chip illustrating unintended capacitance impact on a VLSI design resulting from inclusion of a MIM capacitor. In this example, VDD (power) and VSS (ground) nodes on metal layer MX+1 are connected to the CTM node 202 and CBM node 204 of the MIM capacitor, respectively, by conductive vias 206. However, the presence of the MIM capacitor also introduces unintended capacitances between the MIM capacitor and signal paths on the neighboring metal layers MX and MX+1. For example, a capacitance is established between CTM node 202 and signal path 208, as well as between CBM node 204 and signal paths 210 and 212. Presence of the MIM capacitor can also increase segment-to-segment capacitance variance due to reduced oxide thickness.

In addition to these issues, restrictive design rules regarding MIM capacitors add another layer of complexity that reduces the practicality of introducing MIM capacitors in VLSI designs. Without taking these numerous factors into consideration, the performance drawbacks brought about by addition of MIM capacitors may outweigh the benefits.

To address these and other issues, one or more embodiments described herein provide a design methodology and system that substantially maximizes the benefits of including MIM capacitors in a VLSI design while substantially minimizing the negative impacts resulting from increased capacitance. In general, the methodology is implemented in three stages. First, a process analysis is performed on the VLSI design to determine the impact of adding MIM capacitance to the system. This process analysis is based on several metrics according to a consistent method in order to identify how a MIM capacitor cell can be created to substantially maximize the benefit while minimizing performance degradations. In the second stage, MIM capacitor cells are created based on results of the process analysis. Finally, the MIM capacitor cells are placed at selected locations on the die in an algorithmic fashion in order to satisfy a design target.

Figure 3:
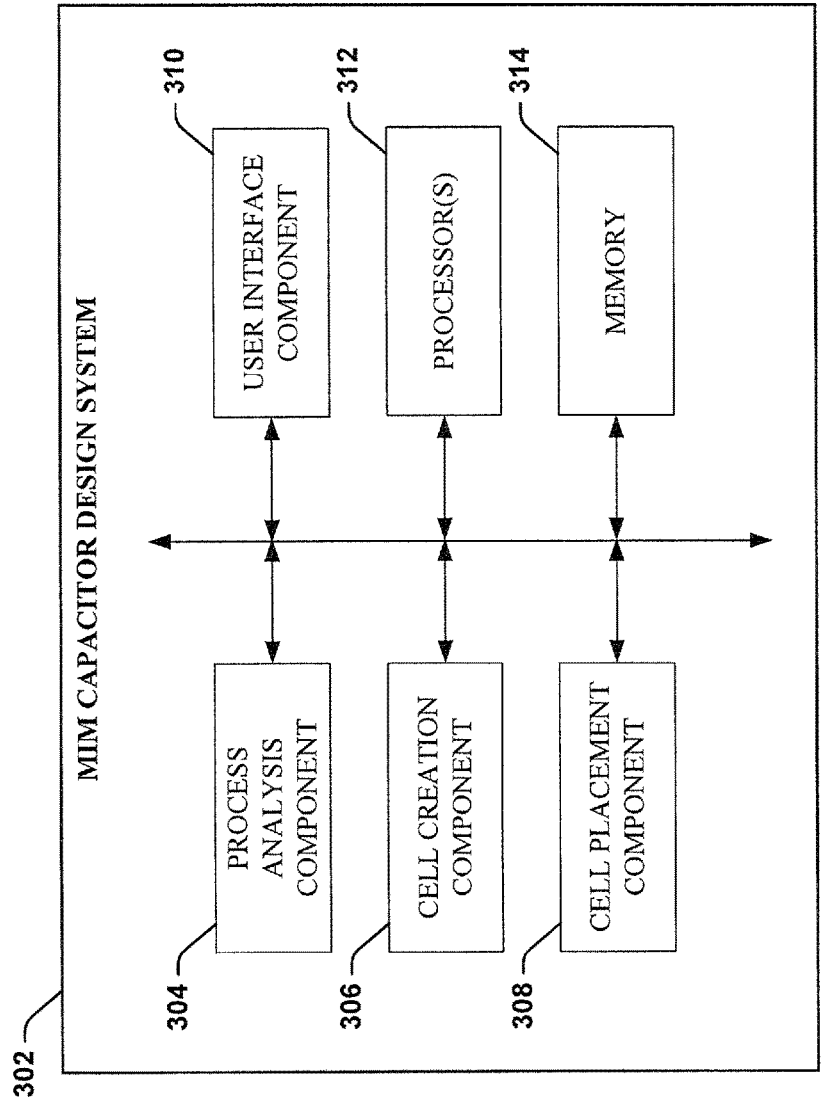
FIG. 3 is a block diagram of an example MIM capacitor design system.

FIG. 3 is a block diagram of an example MIM capacitor design system 302 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

MIM capacitor design system 302 can include a process analysis component 304, a cell creation component 306, a cell placement component 308, a user interface component 310, one or more processors 312, and memory 314. In various embodiments, one or more of the process analysis component 304, cell creation component 306, cell placement component 308, user interface component 310, the one or more processors 312, and memory 314 can be electrically and/or communicatively coupled to one another to perform one or more of the functions of the MIM capacitor design system 302. In some embodiments, components 304, 306, 308, and 310, can comprise software instructions stored on memory 314 and executed by processor(s) 312. MIM capacitor design system 302 may also interact with other hardware and/or software components not depicted in FIG. 3. For example, processor(s) 312 may interact with one or more external user interface devices, such as a keyboard, a mouse, a display monitor, a touchscreen, or other such interface devices.

Process analysis component 304 can be configured to analyze design data describing a VLSI semiconductor chip design to determine relative capacitance impacts of one or more MIM capacitors on neighboring metal layers. In some embodiments, process analysis component 304 can also identify critical circuits or signals of the VLSI design that are to be taken into consideration when determining MIM capacitor placement.

Cell creation component 306 can be configured to generate cell design data describing MIM capacitor cells to be placed on the die. The cell design data is generated based on results of the process analysis component 304, and can describe such cell features as the length, width, and orientations of the MIM capacitor cells to be placed on the die.

Cell placement component 308 can be configured to determine suitable placements for the MIM capacitor cells designed by the cell creation component 306. In general, cell placement component 308 places the cells at selected locations to yield a final design that substantially maximizes MIM capacitor density while avoiding adverse impact on important signals.

User interface component 310 can be configured to receive input data from a user input device or peripheral (e.g., a keyboard, a mouse, a touchscreen, etc.), and to send output data to a user output device (e.g., a display device). Input data received via the user interface component 116 can include, for example, VLSI design information such as semiconductor layer information, information describing signal routing on respective layers, identification of critical cells (e.g. electrostatic discharge cells, cells from different power domains relative to the power domain of the MIM capacitors, etc.), sensitive circuits or design critical components of the VLSI, or other such information. Output data can include MIM capacitor design information, including but not limited to the dimensions, number, orientation, and placement location on the die for one or more MIM capacitor cells. In some embodiments, output data may include modified VLSI design data, which adds the aforementioned MIM capacitor design data to an existing VLSI design described by the VLSI design data.

The one or more processors 312 can perform one or more of the functions described herein with reference to the systems and/or methods disclosed. Memory 314 can be a computer-readable storage medium storing computer-executable instructions and/or information for performing the functions described herein with reference to the systems and/or methods disclosed.

Figure 4:
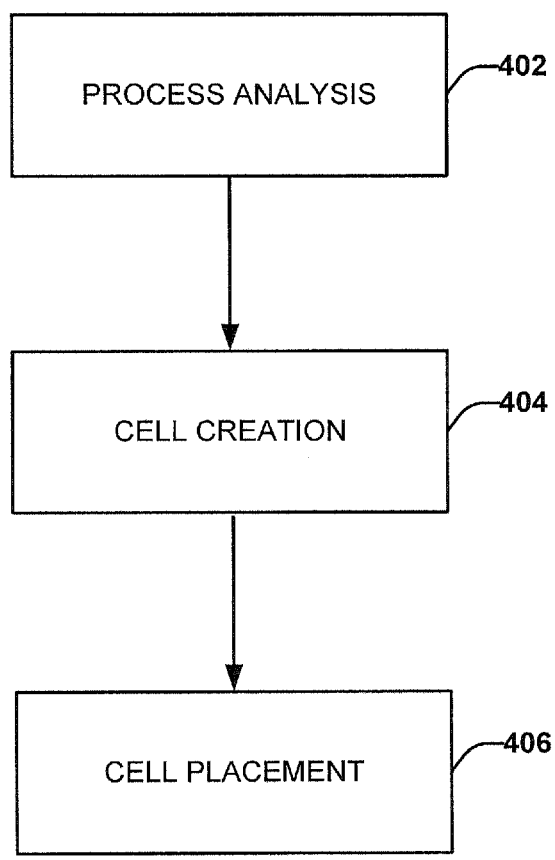
FIG. 4 is a block diagram illustrating a three-phase process for MIM capacitor design and placement.

As noted above, the systems and methods described herein implement a three-phase technique for MIM capacitor design and placement, as illustrated in FIG. 4. Initially, a process analysis phase 402 (which may be carried out, for example, by process analysis component 304 of FIG. 3) perform an analysis of VLSI design information provided to the design system 302. The process analysis is based on the observation that the presence of a MIM capacitor within a VLSI can significantly affect the wire parasitic of surrounding metal layers. An analysis of the VLSI process with regard to MIM capacitor placement can significantly improve the performance of signal wires in the vicinity of the MIM capacitor. Typically, as a MIM capacitor is formed between two metal layers MX and MX+1 (see FIG. 1), it can create a capacitor with a signal wire above and/or below its top and bottom plates, respectively (see FIG. 2). Of these two neighboring metal layers, there is typically one metal layer which the MIM capacitor has a stronger propensity to affect. Due to the fact that the MIM capacitor is created between thick di-electric layers, the more affected metal layer is a global interconnect layer that has a specific routing orientation. Knowledge of which metal layer is more affected by the presence of a MIM capacitor—referred to herein as the impacted metal layer, or IML—can allow the design system 302 to orient the MIM capacitor cells in a manner that minimizes the capacitance impact on signal paths on that layer. Specifically, the design system 302 will select a lengthwise orientation for the MIM capacitor cells that matches the routing orientation of the metal layer that is most impacted by the MIM capacitor's presence. In general, the design target sought by the design system 302 is to place the MIM capacitor cells on the die in a way that does not introduce, or substantially minimizes, additional parasitic to surrounding signal networks while also covering a maximum amount of die area given identified constraints (to be described in more detail below).

Accordingly, the process analysis phase 402 analyzes the VLSI design data to identify relative capacitance impacts that presence of a MIM capacitor cell would have on its respective neighboring metal layers MX and MX+1. In particular, given the addition of a MIM capacitor between two metal layers MX and MX+1, the process analysis phase 402 analyzes the VLSI design data to identify which of the two metal layers—MX or MX+1—is likely to be the most affected by the presence of a MIM capacitor, and designates this layer as the IML. The process analysis phase 402 also identifies the routing orientation of this identified IML so that the lengthwise orientation of the MIM capacitor cells can be set to match this routing orientation.

Upon identification of the IML by the process analysis phase, the design system 302 implements the cell creation phase 404 (which may be carried out, for example, by cell creation component 306 of FIG. 3). During this phase, the system designs individual MIM capacitor cells to be placed within the VLSI. The design target implemented by the cell creation phase is to construct the MIM capacitor cells to provide as much MIM coverage area as possible within a designated areas of the die (the designated areas comprising areas that have not been designated as blockage areas, as will be described in more detail below). To this end, the design system 302 designs a family of MIM capacitor cells of various sizes to be placed on the semiconductor die. Each MIM capacitor cell includes the power (VDD) and ground (VSS) connectivity that defines the capacitor.

The design system 302 considers two dimensions for each cell—the length and the width. The length of each MIM capacitor cell is defined by the routing orientation of the IML; that is the MIM capacitor cells will be oriented on the die such that the direction of the length dimension matches the routing orientation of the IML identified by the process analysis phase. The specific lengths of the cells are sized to substantially maximize design capacitance by covering as much area as possible while avoiding identified blockage areas. To this end, the system may select a number of different cell lengths, which will be placed on the die in an iterative manner—starting with the longest cells and proceeding downward to the shortest—during the cell placement phase 406.

In some embodiments, the design system 302 may dynamically select a number of different MIM capacitor cell lengths to be used in the design, based on an analysis of the area(s) of the die to be covered after the blockage areas have been removed from consideration. The number and magnitude of the different MIM capacitor cell lengths may be determined, for example, based on the contours of the areas to be covered. In an example technique for defining a set of cell lengths to be used, the system 302 may identify, as the longest permitted cell length, a longest length capable of being placed on the available area to be covered (while conforming to the orientation restriction selected based on the routing orientation of the IML). The system may then select a smallest cell length to be used, based either on a smallest size capable of being fabricated on the die, a minimum size selected by a designer, a smallest area of the die requiring capacitor coverage, or other such criteria. With the maximum and minimum lengths identified, the system may generate a defined number of intermediate cell lengths between the largest and smallest lengths. These intermediate lengths may be selected based on various design parameters and/or algorithms. For example, a total number of different cell lengths to be included in the design may be defined by the user (or by system default), and the system can interpolate the intermediate lengths between the largest and smallest lengths to yield the defined number of lengths, such that the incremental size difference between adjacent lengths is substantially equal for each pair of adjacent lengths.

In general, longer MIM capacitor cells tend to be the most effective. However, the inclusion of smaller cells to cover areas too small for the larger cells can yield greater MIM coverage area. Accordingly, during cell placement, the system will attempt to maximize the number of the longest MIM capacitor cells used to cover the designated (non-blocked) areas, while minimizing inclusion of the smaller cell lengths.

As an alternative to dynamic generation of cell lengths, some embodiments of the design system 302 may allow a user to define the set of MIM capacitor lengths permitted to be used in the design. In such embodiments, the user may define the number of different valid lengths, as well as the magnitudes of the lengths. The design system will use these defined lengths as design parameters, and limit the MIM capacitor design to include MIM capacitor cells that conform to the defined lengths.

The width of each cell, which is orthogonal to the routing orientation of the IML, is set to be identical across all the cells. Specifically, this width is set to match the power grid of the IML in order to maximize capacitor area.

Figure 5:
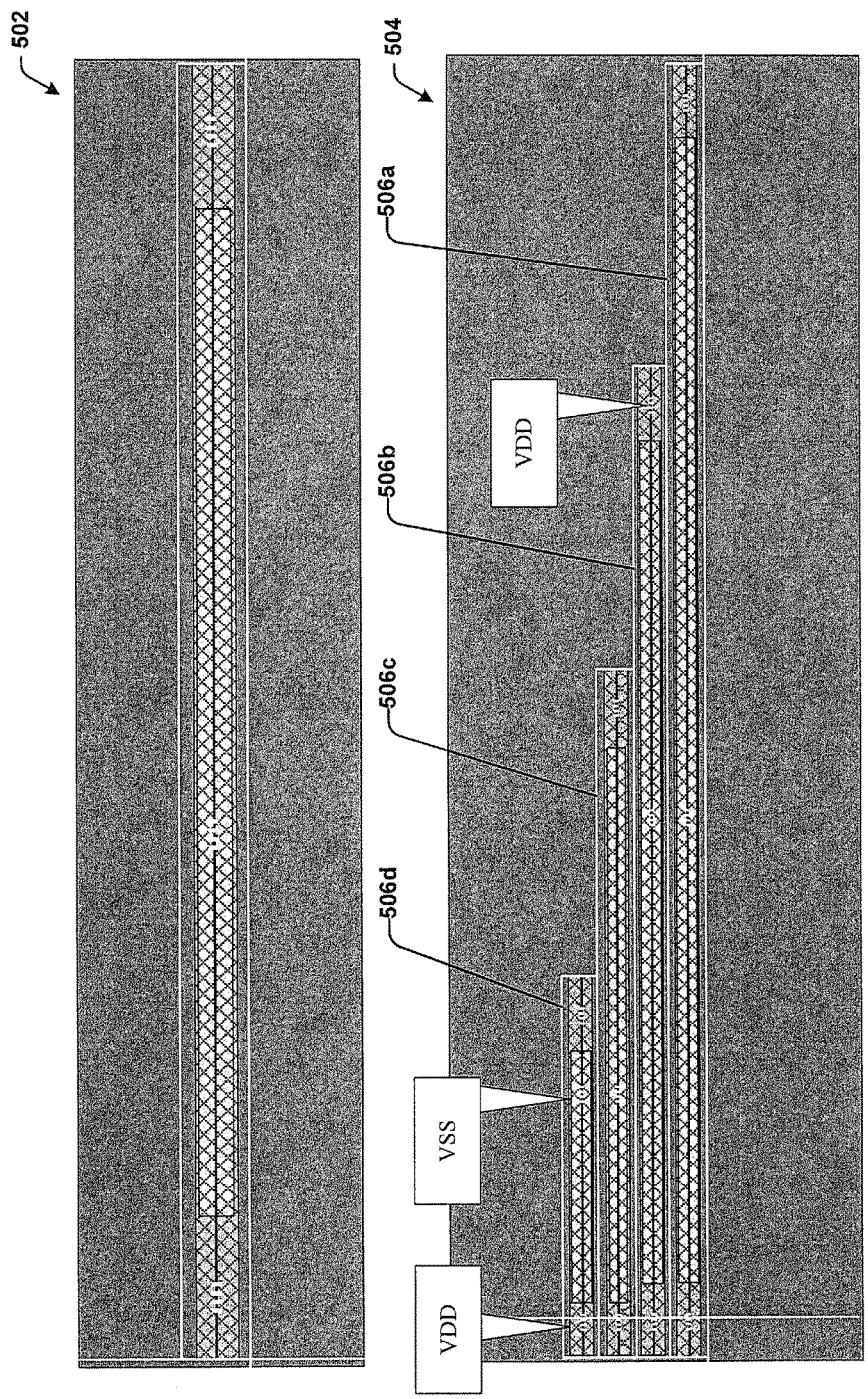
FIG. 5 is a side view and a top view of an example family of four MIM capacitor cells of varying lengths and identical width.

FIG. 5 illustrates a side view 502 and a top view 504 of an example family of four MIM capacitor cells of varying lengths (as shown in side view 502) and identical width (as shown in top view 504) designed by the cell creation phase for a particular design, with corresponding power grid architecture. Based on the VLSI design parameters—e.g., the size and shape of the die area to be covered, locations and sizes of sensitive circuits or components, locations of signal paths on the metal layers MX and MX+1, etc.—the system can determine a suitable number of different lengths for the cells (in the case of dynamic length selection), and a number of cells corresponding to each length, that will substantially maximize the coverage area afforded by the cells while avoiding identified blockage areas in order to substantially minimize the capacitance impact of the cells.

Returning now to FIG. 4, with the lengths and width of the cells determined, the system determines suitable placement locations for the MIM capacitor cells during the cell placement phase 406. In some embodiments, cell placement can be performed algorithmically, with the cell placement phase divided into two steps. In the first step, the design system 302 generates placement blockage information based on the VLSI design information and any relevant user input (provided via the user interface component 310). In the second step, the system determines cell placement locations that collectively yield substantially maximized coverage area, taking the identified blockage information into account.

The system can consider several facets when determining placement blockage information, depending on the particular VLSI design being considered. For example, as noted above, the system considers signal routing orientation on the identified IML, and mirrors the cell orientations on the MIM layer to match this signal routing in order to reduce parasitic. The system also considers critical cells that are part of the VLSI design, such as electrostatic discharge (ESD) cells or cells associated with power domains that are different than that of the MIM capacitors. In one or more embodiments, the system can identify this critical cell information based on the VLSI design information provided to the system, and/or user input that manually identifies these critical cells. The system may also receive user input that identifies sensitive circuits or design critical components. Collectively, these identified critical cells and sensitive components are used by the system to generate blockage information defining areas of the die that should not be overlapped by the MIM capacitor cells, or which should be avoided during cell placement. During placement determination, the system will select locations and orientations for the MIM capacitor cells that both mirror the routing orientation of the IML and avoid overlap with the identified critical cells. It is to be appreciated that the blockage criteria described above is only intended to be exemplary, and that any combination of suitable blockage criteria are within the scope of one or more embodiments.

After placement blockage information has been generated, the system determines placement locations for the MIM capacitor cells. Broadly speaking, the three-fold design target for the placement of MIM capacitor cells comprises (1) ensuring that each MIM capacitor cell is oriented lengthwise to match the routing orientation of the IML, (2) avoiding overlap with blockage areas identified by the blockage information, and (3) maximizing MIM capacitor coverage while satisfying the first two criteria. The design system can also take into consideration any additional placement restrictions associated with cells in order to avoid placing MIM capacitor cells in a manner that violates foundry design rules.

In an example cell placement procedure, the system can place the cells iteratively, starting with the longest cells and proceeding down to the shortest cells. For example, the system may first place as many of the longest cells (e.g., cells corresponding to cell 506*a* in FIG. 5) as will fit in the available coverage area (ensuring that the cells are oriented to match the routing orientation of the IML) without overlapping with the identified blockage areas. Upon completion of placement of the longest cells, a number of uncovered areas may remain that are too small to accommodate any additional cells of the longest length. The system then proceeds to fill these remaining uncovered areas, to the degree possible, with cells corresponding to the second-longest length (e.g., cell 506*b* of FIG. 5) until no more cells of this length can be fit within the remaining uncovered areas. This process repeats for the sequentially decreasing lengths (e.g., cells corresponding to cells 506*c* and 506*d* of FIG. 5), working down through the cell lengths until cells of the smallest length have been placed and the smallest cell lengths can no longer fit in the remaining uncovered areas.

In some embodiments, this placement procedure may be performed multiple times in an iterative fashion, testing different cell placements with each iteration, in order to substantially optimize the coverage area without violating the blockage constraints. That is, after a first iteration is completed, the system my gauge one or more metrics of the completed design for comparative purposes, including but not limited to total area covered, percentage of the coverage that is achieved using cells of the longest cell length, or other such metrics. The system may then perform a second iteration of the placement process, again beginning with the longest cell length but varying the placement of the cells relative to the first iteration. Upon completion of the second iteration, metrics are again recorded for the completed design for comparison with the first set of metrics. Upon completion of a selected or defined number of iterations, the system may select the design having the most favorable metrics of all the executed iterations.

As the shortest MIM capacitor cells are being placed, placement of these shortest cells will continue until none of the remaining uncovered areas are large enough to accommodate a MIM capacitor cell corresponding to the shortest length. This condition signals the end of the MIM capacitor design sequence (or the end of an iteration in the case of the iterative placement procedure described above). After completion of the design sequence (or upon selection of a preferred design iteration), the design system can generate output data conveying the sizes, orientations, and locations of the MIM capacitor cells on the semiconductor chip. This output data can comprise, for example, a modified version of the original VLSI design data that includes information conveying the sizes, orientations, and locations of the MIM capacitor cells; a schematic of the VLSI that includes the MIM capacitor cell design; a text-based output identifying the sizes, orientations, and locations of the MIM capacitors, or another suitable output. In some embodiments, the design system may communicatively interface with a semiconductor chip fabrication system, and provide the MIM capacitor information to the fabrication system as a set of instructions that inform the fabrication system where to form the MIM capacitor cells.

Figure 6:
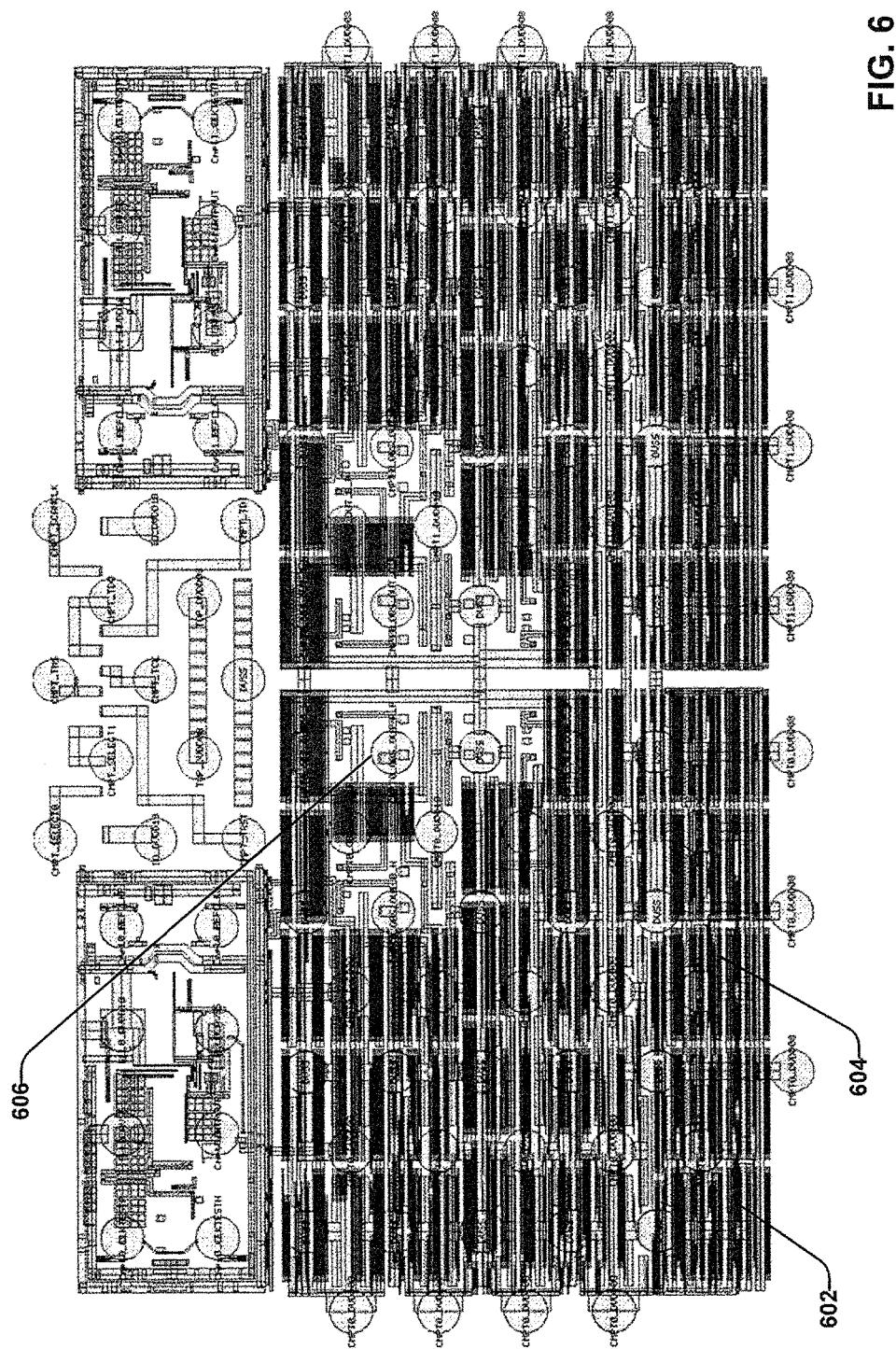
FIG. 6 is a top-view schematic of an example VLSI design that includes MIM capacitors placed and oriented in accordance with design techniques described herein.

The completed design yielded by the three-phase process described above can achieve a substantially maximized MIM capacitor area coverage while having minimal impact on routed signal networks due to MIM capacitor placement. FIG. 6 is a top-view schematic of an example VLSI design that includes MIM capacitors placed and oriented in accordance with the design techniques described above. MIM capacitor cells 602 are represented as dark grey blocks, and reside in a MIM capacitor layer between two metal layers. In this example VLSI design, the MIM capacitor cells are oriented horizontally to match the routing orientation of the IML of this particular semiconductor chip. In accordance with the design techniques described above, the cells 602 have also been placed to avoid overlap with blockage areas, such as sensitive circuits 606 (which reside on one or both of the metal layers that neighbor the MIM capacitor layer). Moreover, the cells 602 have been placed to avoid overlap with signal routing paths 604 of the IML, which can be seen as horizontal white lines between the cells 602 in FIG. 6.

Figure 7A:
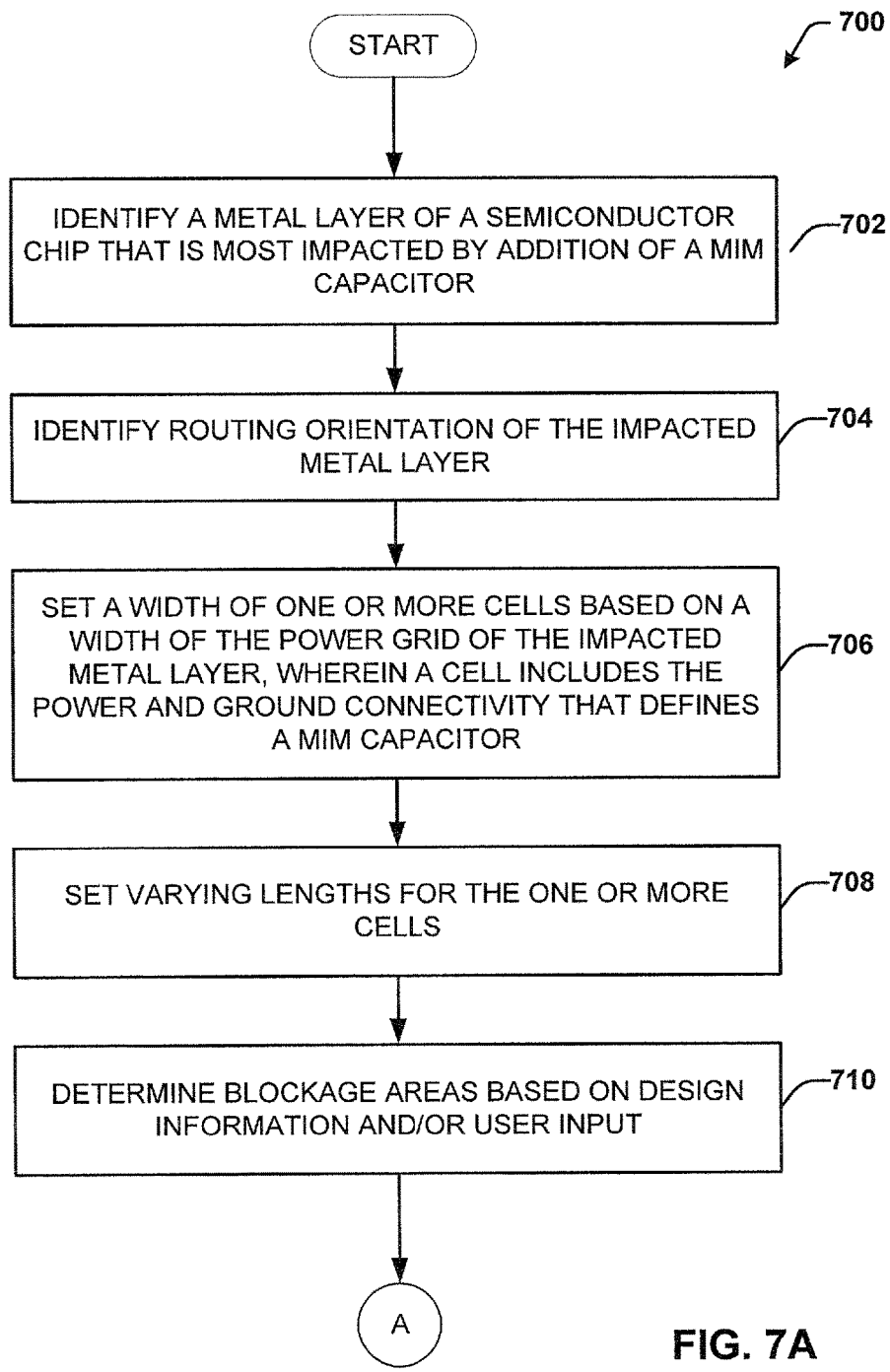
FIG. 7A is first part of a flow diagram of an example, non-limiting embodiment for designing MIM capacitor size, orientation, and placement on a VLSI embodied on a semiconductor chip.
Figure 7B:
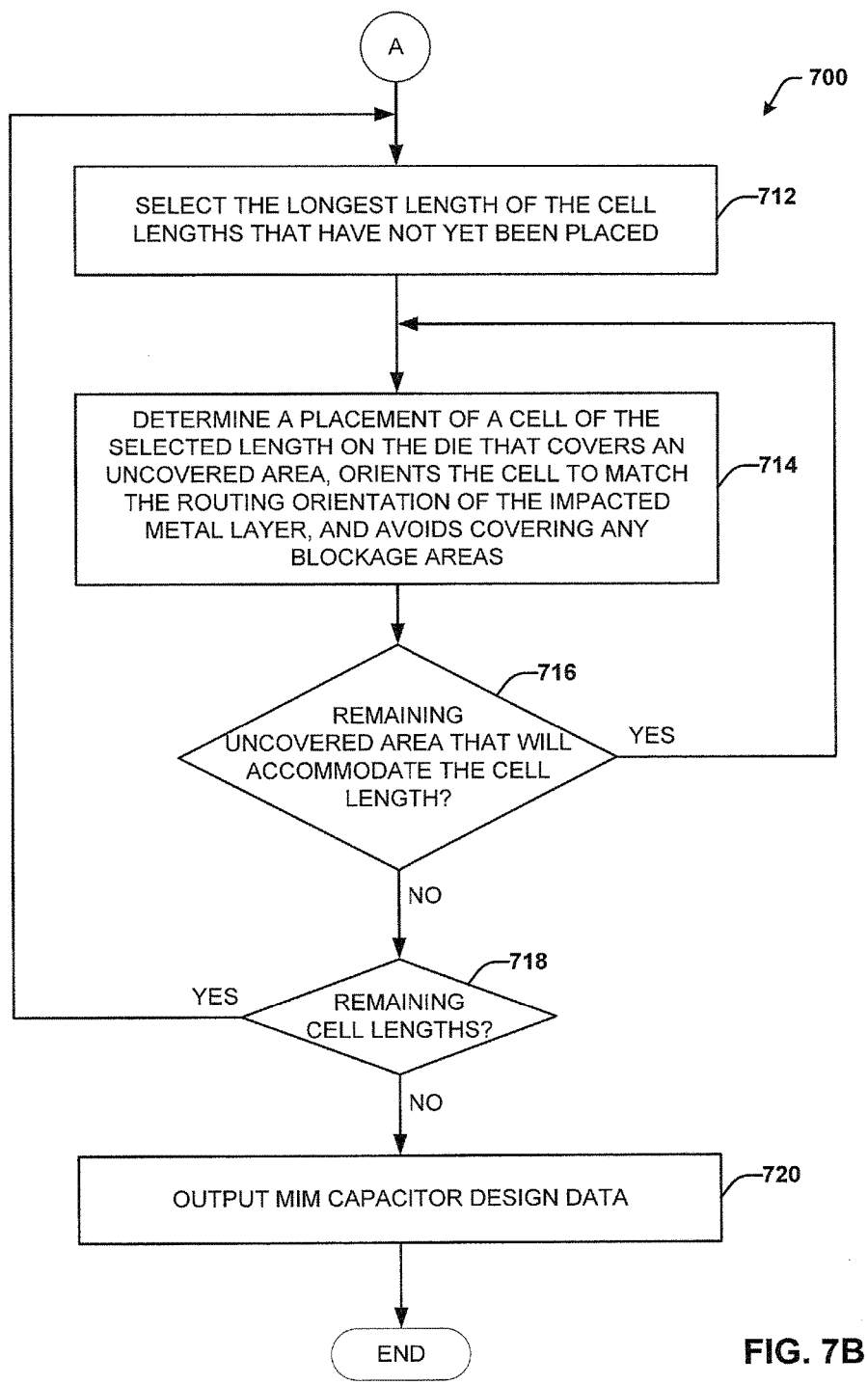
FIG. 7B is second part of a flow diagram of an example, non-limiting embodiment for designing MIM capacitor size, orientation, and placement on a VLSI embodied on a semiconductor chip.

FIGS. 7A-7B illustrate an example methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 7A, a first part of a flow diagram of an example, non-limiting embodiment for designing MIM capacitor size, orientation, and placement on a VLSI embodied on a semiconductor chip is shown. Methodology 700 can begin at block 702, where a metal layer of a semiconductor chip that is likely to be most impacted by addition of a MIM capacitor is identified. The identified metal layer—referred to herein as the IML—is typically one of the two metal layers MX and MX+1 that neighbor the layer in which the MIM capacitor will reside. Identification of the IML can be based on a determination of which metal layer contains signal networking that is more likely to be negatively affected by increased capacitance associated with addition of the MIM capacitor (e.g., increased capacitance between the MIM capacitor's CTM or CBM node and the metal layer's signal paths, increased segment-to-segment capacitance variance, etc.).

At 704, the routing orientation of the most impacted metal layer is identified. At 706, a width of one or more MIM capacitor cells is set based on width of the power grid of the impacted metal layer. Each of the MIM capacitor cells includes the power (VDD) and ground (VSS) connectivity that defines a MIM capacitor. At 708, varying lengths for the one or more cells are set. Any number of varying lengths between the one or more cells can be defined, provided the shortest length is not less than can be manufactured on the chip and the longest length does not exceed the length of the chip (as defined by the routing orientation of the IML). In some embodiments, the number and magnitude of the different cell lengths can be determined dynamically by the design system; e.g., based on an analysis of the size and contours of the areas to be covered by the MIM capacitor cells. Alternatively, the lengths may be set manually by user input, or may be selected dynamically by the system in view of one or more constraints provide by user input (e.g., a maximum and/or minimum cell length).

At 710, blockage areas of the semiconductor chip are determined based on VLSI design information and/or relevant user input. For example, based on analysis of VLSI design information or on user input, critical or sensitive cells that are part of the VLSI design can be identified (e.g., electrostatic discharge (ESD) cells, cells from different power domains, etc.). The analysis can also identify signal paths or networks on the neighboring metal layers, and record the locations of these signal paths as blocking areas. The blockage information, which identifies locations on the die that should be avoided during MIM capacitor cell placement, can be based on the locations and/or orientations of these critical cells and signal paths.

Methodology 700 continues in FIG. 7B. Steps 712-718 represent the cell placement phase. At 712, the longest length of the cell lengths (which were set at step 708) that have not yet been placed on the die is selected. At 716, placements of cells of the length selected at step 714 on the semiconductor die are determined. Placing the cells includes determining an area of the MIM capacitor layer that has not yet been covered by a placed cell, orienting the cell on the uncovered area such that the lengthwise direction of the cell matches the routing orientation of the IML, and avoiding overlap with any blockage areas determined at step 710.

At 716, a determination is made regarding whether any uncovered areas remain that will accommodate the cell length selected at step 712. If the uncovered area includes a portion that will accommodate the cell length (YES at step 716), step 714 is repeated to place another cell of the selected length at the identified portion of the uncovered area. Alternatively, if the remaining uncovered area does not include a portion that will accommodate the selected length—that is, the remaining uncovered areas are too small to allow a cell of the selected area to be placed—(NO at step 716), the methodology proceeds to step 718, where a determination is made regarding whether there are remaining cell lengths of the lengths set at step 708. If there are remaining cell lengths (YES at step 718), the methodology returns to step 712, where the longest length of the remaining cell lengths that have not yet been placed is selected, and steps 714 and 716 are repeated for the newly selected cell length. Alternatively, if there are no remaining cell lengths (NO at step 718), the methodology proceeds to step 720, where MIM capacitor design data identifying the MIM capacitor cell sizes, locations, and orientations obtained by the methodology is output, and MIM capacitor design is complete.

In some embodiments, placement steps 712-718 may be repeated iteratively, with step 714 selecting a different combination of placements with each iteration. In such embodiments, when a defined number of iterations have been completed, the methodology will compare recorded metrics from each completed design arising from each iteration, and select a design having the most favorable metrics of all the performed iterations. The design data output at step 720 will be generated based on this selected design.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for placement of metal-insulator-metal (MIM) capacitors on a semiconductor chip, comprising:
analyzing, by a system comprising a processor, design information relating to an integrated circuit design;
identifying, by the system based on a result of the analyzing, which metal layer, of a first metal layer or a second metal layer, has a likelihood of being more affected by additional parasitic capacitance introduced by presence of MIM capacitor cells; and setting, by the system, a lengthwise orientation of the MIM capacitor cells on the semiconductor chip that matches a routing orientation of the metal layer that has the likelihood of being more affected by the additional parasitic capacitance.

2. The method of claim 1, further comprising setting, by the system, widths of the MIM capacitor cells to be approximately equal to a width of a power grid of the metal layer that has the likelihood of being more affected by the additional parasitic capacitance.

3. The method of claim 2, further comprising setting, by the system, respective lengths of the MIM capacitor cells to conform to one of a set of different defined lengths.

4. The method of claim 3, further comprising determining, by the system, blocking areas of a layer in which the MIM capacitor cells are to be placed, wherein the blocking areas represent areas that are not to be covered by MIM capacitor cells.

5. The method of claim 4, wherein the determining the blocking areas comprise at least one of determining an area corresponding to a signal path on at least one of the first metal layer or the second metal layer, determining an area corresponding to electrostatic discharge cells on at least one of the first metal layer or the second metal layer, determining an area corresponding to a critical cell on at least one of the first metal layer or the second metal layer, determining an area corresponding to a sensitive circuit on at least one of the first metal layer or the second metal layer, or determining an area corresponding to a circuit associated with a different power domain relative to the MIM capacitor cells.

6. The method of claim 4, further comprising:
selecting a longest length of the set of different defined lengths; and
selecting a location, on an uncovered area of the layer that has not yet been covered by a MIM capacitor cell and that does not overlap with one of the blocking areas, for placement of one of the MIM capacitor cells corresponding to the longest length, wherein the determining the location comprises setting the lengthwise orientation of the one of the MIM capacitor cells to match the routing orientation of the metal layer that has the likelihood of being more affected by the presence of the MIM capacitor cells.

7. The method of claim 6, further comprising:
in response to determining that a remaining portion of the uncovered area has a size capable of accommodating another MIM capacitor cell corresponding to the longest length and having the lengthwise orientation that matches the routing orientation, selecting another location on the uncovered area for placement of another of the MIM capacitor cells corresponding to the longest length; and
in response to determining that no remaining portions of the uncovered area have the size capable of accommodating another MIM capacitor cell corresponding to the longest length and having the lengthwise orientation that matches the routing orientation:
selecting a next longest length of the set of different defined lengths; and
selecting another location on the uncovered area that has not yet been covered by a MIM capacitor cell and that does not overlap with one of the blocking areas for placement of another of the MIM capacitor cells corresponding to the next longest length.

8. The method of claim 7, further comprising, in response to determining that no remaining portions of the uncovered area have a size capable of accommodating a MIM capacitor cell corresponding to a shortest length of the set of different defined lengths, ending placement of the MIM capacitor cells and generating output data identifying locations and sizes of the MIM capacitor cells on the semiconductor chip.

9. The method of claim 8, wherein the generating the output data comprises at least one of modifying the design data to include the locations and sizes of the MIM capacitor cells to yield modified design data, generating a schematic illustrating the sizes and locations of the MIM capacitor cells, or generating a text-based output identifying the locations and sizes of the MIM capacitor cells.

10. The method of claim 8, further comprising sending the output data to a semiconductor chip fabrication system.

\* \* \* \* \*